United States Patent [19]
Rylov

[11] Patent Number: 5,936,458
[45] Date of Patent: Aug. 10, 1999

[54] SUPERCONDUCTING ANALOG AMPLIFIER CIRCUITS

[75] Inventor: Sergey V. Rylov, North White Plains, N.Y.

[73] Assignee: Hypres, Inc., Elmsford, N.Y.

[21] Appl. No.: 08/897,475

[22] Filed: Jul. 21, 1997

[51] Int. Cl.$^6$ ...................................................... H03K 3/38
[52] U.S. Cl. ........................... 327/528; 330/286; 505/855
[58] Field of Search .................... 330/61 R, 54, 330/53, 286; 505/855, 832, 864; 257/31, 36; 327/528

[56] References Cited

U.S. PATENT DOCUMENTS

| | | | |
|---|---|---|---|
| 4,361,768 | 11/1982 | Rajeevakumar | 307/245 |
| 4,749,888 | 6/1988 | Sakai et al. | 333/995 |
| 5,208,547 | 5/1993 | Schindler | 330/53 |
| 5,365,197 | 11/1994 | Ikalainen | 330/286 |
| 5,479,131 | 12/1995 | Lee | 327/367 |

*Primary Examiner*—Robert Pascal
*Assistant Examiner*—Khanh Van Nguyen
*Attorney, Agent, or Firm*—Henry I. Schanzer

[57] ABSTRACT

Josephson transmission structures (JTSs) which include Josephson transmission lines (JTLs) with filter circuitry and flux release circuitry. Two or more of these JTSs may be interconnected to form a superconducting high-gain operational amplifier intended for general-purpose analog signal processing is disclosed. The active elements of the amplifier are non-hysteretic Josephson junctions configured as dc SQUIDs (used as flux-to voltage transducers and impedance transformers) and Josephson transmission lines (used as the main source of power gain). The amplifier has inverting and non-inverting voltage inputs, which can be fed from any low-resistance low-voltage sources, including dc SQUIDs. The output of the amplifier is in the form of a voltage which can drive typical transmission line impedances (e.g., 10–100 ohms). The variety of possible sources of input signals and the high gain of the amplifier enables wide range of applications including linear signal amplifiers, integrators, active filters and phase-locked oscillators.

36 Claims, 12 Drawing Sheets

SUPERCONDUCTING ANALOG AMPLIFIER CIRCUITS

BACKGROUND OF THE INVENTION

This invention relates to superconducting analog amplifiers, and more particularly to superconducting analog amplifiers employing Josephson junctions.

Superconducting electronic circuitry lacks active three-terminal devices equivalent to semiconductor transistors. Existing superconducting active devices are based on Josephson junctions (JJs) which are two-terminal devices, and hence have relatively low gain. A high-gain superconducting amplifier can be produced by connecting a sufficiently large number of Josephson junction stages in series (i.e., cascading them). The rapid progress of superconducting LSI integrating technology has made this approach quite practical. However, to date, there is no known general-purpose high-gain superconducting amplifier (or a combination thereof) designed to have properties equivalent to those of a semiconductor operational amplifier (OP-AMP).

Known Josephson junction analog signal amplifiers include the use of direct current (dc) connected superconducting quantum interference devices (dc SQUIDs). SQUIDs have been extensively studied and their properties are described in numerous publications. By way of example, reference is made to the following articles: (a) K. K. Likharev, "Dynamics of Josephson Junctions and Circuits", Chapter III, Gordon and Breach Science Publishers, 1986; and (b) John Clarke, "SQUIDS: Principles, Noise and Applications", In: "Superconducting Devices", edited by S. T. Ruggiero and D. A. Rudman, Academic Press, Inc., 1990; These teachings are incorporated herein by reference.

Referring to FIG. 1a, there is shown a 2-junction superconducting quantum interferometer device (2-junction dc SQUID). The 2-junction dc SQUID consists of a superconducting loop 10 containing two non-hysteretic Josephson junctions (J1, J2) and two inductors (L1,L2). The loop 10 includes two branches connected in parallel between nodes 13 and 15; one branch includes J1 and L1 connected in series between nodes 13 and 15 and the other branch includes J2 and L2. A bias current Ib is supplied to node 13 to bias J1 and J2 and node 15 is grounded. Loop 10 is magnetically coupled to a superconducting control line 11 which includes inductive elements L1' and L2' which are magnetically coupled to L1 and L2. In the description to follow and in subsequent drawings, the SQUID of FIG. 1a may be drawn as shown in FIG. 1b. The voltage (V) across nodes 13 and 15 of the SQUID is sensitive to change in the magnetic flux. The control line 11 modulates the amount of magnetic flux in loop 10 which, in turn, modulates the voltage V between nodes 13 and 15 of the SQUID.

As illustrated in FIG. 1b, the voltage V across the interferometer is a function of the bias current $I_b$ into the node 13 and the magnetic flux $\phi_e$ created by the current $I_e$ in the control line 11.

FIG. 1c shows schematically a typical current-voltage (I–V) curve for different values of control flux $\phi_e$ in the interferometer. FIG. 1d shows typical voltage (V/Vc) versus flux $\phi_e/\phi_0$ curves for different values of bias current $I_b$ for the interferometer. The curves in FIG. 1d show that the SQUID response to the control magnetic flux $\phi_e$ is periodic. The period is a fundamental physical constant known as magnetic flux quantum $\phi_0=h/2e=2.07\times10^{-15}$ Wb. The maximum output voltage amplitude for a typical dc SQUID is of the order of 100 $\mu$V.

FIG. 2a shows a prior art single-stage SQUID analog amplifier with a voltage output. The circuit is like that of FIGS. 1a and 1b with the addition of a load resistor RL between node 13 and a point of reference potential 15. FIG. 2a contains a single SQUID biased by a dc current ($I_b$). The input signal is applied in the form of magnetic flux, typically via high-turn-ratio superconducting transformer.

FIG. 2b shows a more complex prior art analog SQUID amplifier which employs a series array of N identical SQUIDs, so the maximum output voltage (Vo) between nodes 130 and 15 is N times larger than that of a single-SQUID amplifier. Note that the power gain of the FIG. 2a circuit is the same as that of the circuit in FIG. 2b, because the SQUIDs in FIG. 2b share the input signal instead of cascading it. However, the circuit of FIG. 2b does have an advantage in that it provides the possibility of matching the output impedance of this amplifier (at node 130) with semiconductor room-temperature devices, which is very difficult to achieve with a single SQUID.

FIG. 2c shows a prior art cascaded 2-stage SQUID amplifier. The first stage of FIG. 2c is a voltage-biased SQUID with the flux output working as an active flux transformer. The second stage uses an array of N SQUIDs connected in series between voltage output node 132 and ground. The advantages of cascaded amplifiers are their higher gain (the gains of the stages are multiplied) and the possibility to optimize different stages for different functions; e.g. the first stage can be optimized for lower noise, while the second stage—for matched impedance.

The small-signal power gain of SQUID amplifiers (per stage) depends on the signal bandwidth; the maximum gain is inversely proportional to the bandwidth, and reaches unity in the GHz band. Wide-band high gain SQUID amplifiers can be obtained by cascading large number of stages. The main disadvantage of this approach is the possible mutual phase locking of the SQUIDs in different stages, which is difficult to suppress. This phenomenon is caused by the ac Josephson effect present in all Josephson devices and leads to increased noise.

Another prior art active device suitable for implementation of superconducting amplifiers is the exponential Josephson transmission line (JTL), also known as the "exponential flux shuttle". Such a device and applications thereof are shown or suggested in a) O. A. Mikhanov, V. K. Semenov and K. K. Likharev, "Ultimate Performance of RSFQ Logic Circuits", IEEE Trans. Magn., MAG-23, 759–762, 1987; and b) M. Gershenson, "Current Amplifier and Flux-Buffer Designs Using an Exponential Flux Shuttle with a Josephson Junction Synthetic Inductor", IEEE Trans. Magn., MAG-25, 1158–1161, 1989. The exponential JTL as shown in FIG. 3A is composed of N single-junction cells, each cell (Ci) detailed in FIG. 3B, consisting of an overdamped Josephson junction (Ji), with a critical current ($I_c$), a superconducting inductor (Li) and a source of bias current ($I_{bi}$). The critical currents of the junctions in the JTL increase exponentially along the line ($I_c^{i+1}/I_c^{i}=q$, q>1), while the ratios $e=2\pi I_c L/\phi_0$ and $b=I_b/I_c$ remain constant. The voltage gain of the JTL is unity (its input and output are connected via superconducting path), however its current gain can be very large. Current amplification is achieved when $I_{inp}$ exceeds the input critical current $I_{ci}$ of the JTL, while $I_{out}$ remains below its output critical current $I_{co}$, so the fluxons are created at the JTL input stage and then flow through the JTL to the output.

An advantage of the JTL-based amplifiers is the easy cascading of stages without "phase-locking" complications of the SQUID-based amplifiers mentioned above; this makes it possible to use them to achieve arbitrary large power gain. The disadvantage of these amplifiers is their very low output impedance, which makes it difficult to match the amplifier output with most loads.

Two JTLs of the type shown in FIG. 3A may be interconnected as shown in FIG. 4. to produce what has been referred to as a "flux buffer" device for analog amplification. This circuit consists of two JTLs (JTL1 and JTL2) with inputs (IN1 and IN2) and outputs (OUT1 and OUT2) mutually connected via superconducting inductors ($L_{INP}$ and $L_{OUT}$). The device functions as an active flux transformer; the Josephson junctions of the JTLs are typically biased slightly above their input critical current, so there is a flux flow along both JTLS. In response to changes of the flux in the input inductor the mutual phase of the two fluxon trains in the two JTLs is continuously changed, so the average flux residing in the output inductor follows the input flux. The energy and power gain of this device at low signal frequencies is close to the ratio of the input inductor to the output one and can be quite large.

The circuit of FIG. 4 has certain desirable features but it suffers from at least the following problems:

a) No means are provided for obtaining a voltage output. Only magnetic flux output is made available;

b) The power gain of the circuit is limited to the ratio of the input inductor to the output inductor; and c) The circuit has considerable amount of ac oscillations at its output and provides no means for suppressing them. This would prevent cascading of such devices due to phase locking.

SUMMARY OF THE INVENTION

An object of the present invention is to address these problems and to make use of existing superconducting active components to produce an analog amplifier, which has significantly larger gain than known superconductive amplifiers and which is capable of accepting a variety of input signal sources.

Applicant's invention resides in the combination of one or more inventive building blocks. A superconducting amplifier embodying the invention includes the combination of a generalized Josephson transmission structure (JTS) with a special output circuit. The JTS includes one or more Josephson transmission lines (JTL's). In the latter case, the JTS also includes a current-collection structure which combines the outputs of multiple JTLs in one point. The output circuit includes a load inductor in series with a flux release device such as a voltage source enabling magnetic flux to be released from the circuit. The flux release device may be a current-biased resistor or another JTS used as a voltage source. The inductor may be magnetically coupled to some magnetic field-responsive device such as an array of biased SQUIDs.

A second inventive building block includes a JTS comprised of multiple JTLs and having a current-collection structure. The JTS collects its output current from multiple "tap" points and introduces relative delays between the signals of the taps. The JTS may be used as a filter. The filter may be a low-pass filter. The correct combination of timing delays in the JTLs at the taps produces the desired filter characteristics. This structure should have higher gain than a simple JTL with a comparable number of junctions.

Another inventive building block is the combination of a magnetically controlled voltage source with a JTS. The source provides the input voltage for the JTS. It consists of an inductor which is magnetically coupled to a biased SQUID or an array of biased SQUIDs. The input current is sent through the inductor, which modulates the magnetic field of the SQUID array. This modulates the voltage across the SQUID array, which changes the voltage applied to the first junction of the JTS.

Still another inventive building block includes a saturation protection technique where one or more Josephson junctions are connected in series with an output loading inductor. The critical current of the junction(s) is exceeded at a level safely below that which would damage the inductor, insuring that the circuit will recover properly after being driven into saturation.

The inventive building blocks may be combined to form a superconducting operational amplifier.

In contrast to the circuit of FIG. 4, circuits embodying the the invention include means for converting the magnetic flux output into a voltage via flux-to-voltage converters such as dc SQUIDs. In circuits embodying the invention, the power gain is dramatically higher and is equal (for small signals) to the ratio of the input differential resistance of the JTL (which is quite high—many Ohms) to the output differential resistance of the JTL (extremely low—micro Ohms and below). The basis for this significant difference is the fact that in the circuit of FIG. 4, the input signal only creates a proportional phase difference between the two JTLs. By contrast, in circuits embodying the invention, the input signal creates a proportional voltage difference between the two JTLS, which results in a linearly growing phase difference between them (see FIG. 12). This difference in modes of operation results in the fact that in the circuit of FIG. 4, the inputs of the two JTLs are directly connected via a superconducting inductor making their voltage difference equal to zero. In circuits embodying the invention, the two input voltages are practically independent.

In circuits embodying the invention, the large signal gain is also considerably better due to use of a JTS instead of a JTL allowing an increase in the output power (and hence the large signal gain) proportionally to the number of JTS branches. Circuits embodying the invention also include a low-pass filtering function between the two JTLs and the output inductor.

BRIEF DESCRIPTION OF THE DRAWINGS

In the accompanying drawing, like reference characters denote like components.

FIG. 1b is a schematic diagram representation of the prior art SQUID circuit of FIG. 1a;

DETAILED DESCRIPTION OF THE INVENTION

Figure 5A:
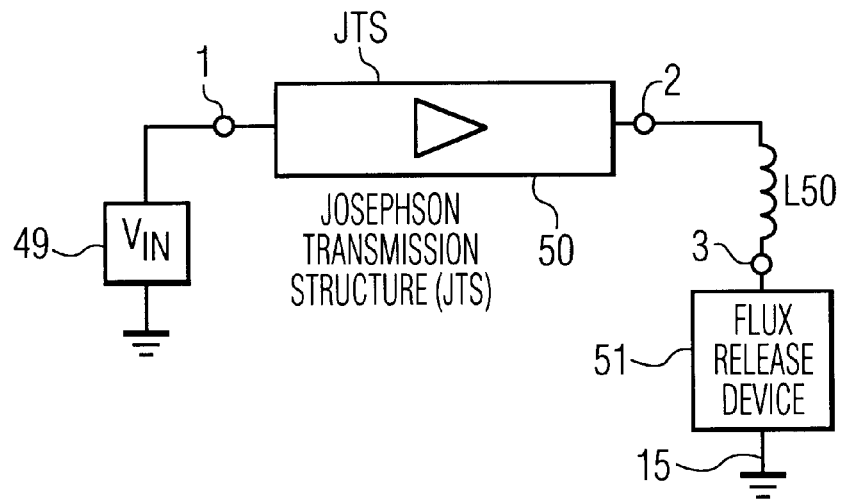
FIG. 5A is a block diagram of a Josephson transmission structure (JTS) and a load circuit in accordance with the invention.

FIG. 5A shows an amplifying apparatus embodying the invention. The amplifying apparatus includes a voltage source 49 applying a voltage $V_{IN}$ to an input terminal 1 of a Josephson transmission structure (JTS) 50. JTS 50 has an output terminal 2 to which is coupled a load circuit comprising an output inductor L50 and a flux release device 51.

Figure 1A:
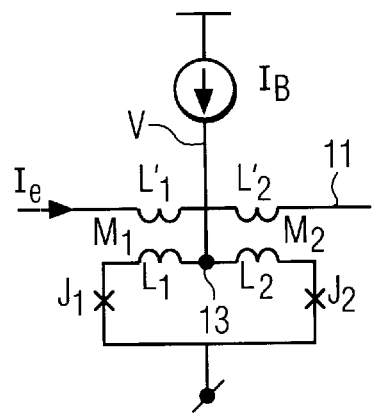
FIG. 1a is a schematic diagram of a prior art two-junction superconducting quantum interference device (SQUID)
Figure 1B:
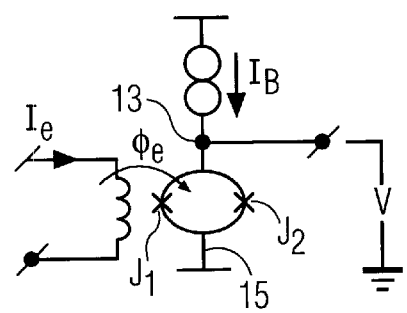
Figure 1C:
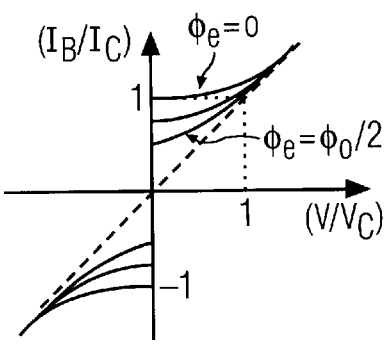
FIG. 1c is a current-voltage (I–V) curve of the SQUID circuit of FIG. 1a for different values of control flux $\phi_e$.
Figure 1D:
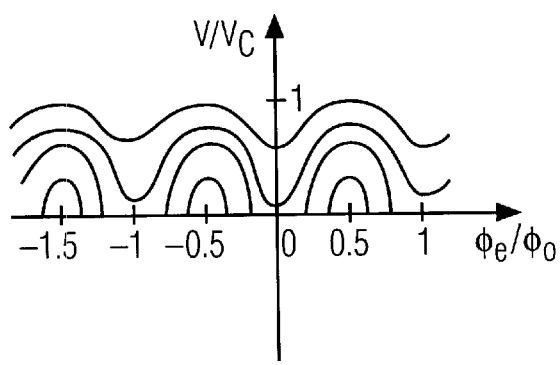
FIG. 1d is a diagram of voltage-flux curves of the FIG. 1a circuit for different values of bias current $I_b$.
Figure 2A:
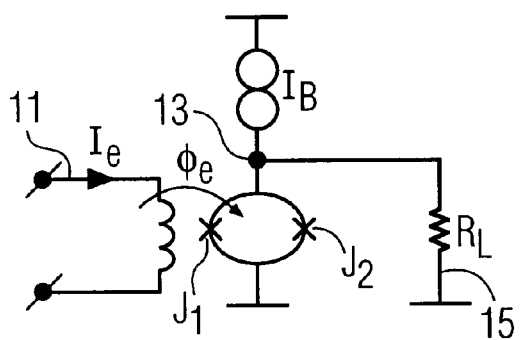
FIG. 2a is a schematic diagram of a prior art analog single-SQUID amplifier.
Figure 2B:
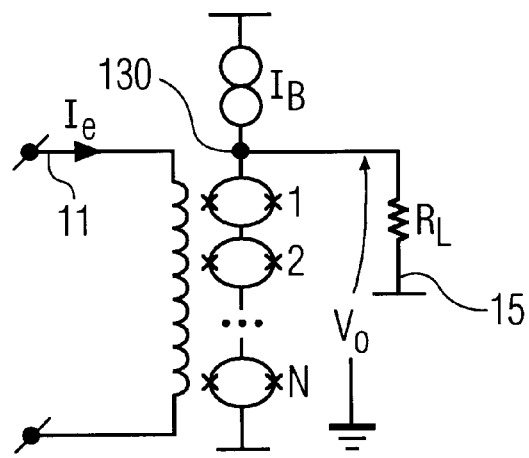
FIG. 2b is a schematic diagram of a prior art analog amplifier using an array of SQUIDs connected in series.
Figure 2C:
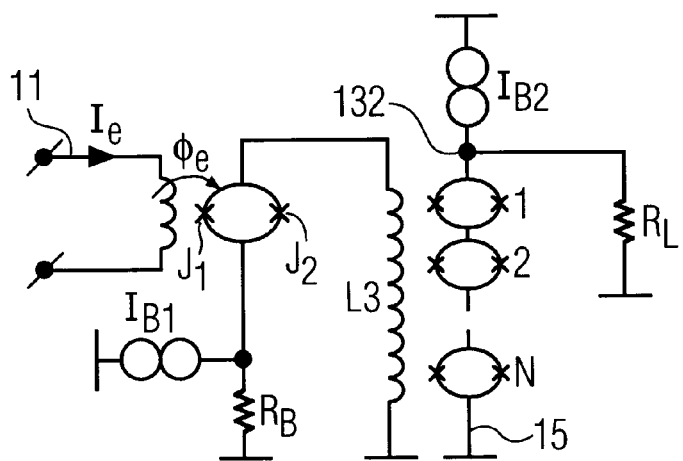
FIG. 2c is a schematic diagram of a prior art analog amplifier using two stages of SQUID amplification.
Figure 3A:
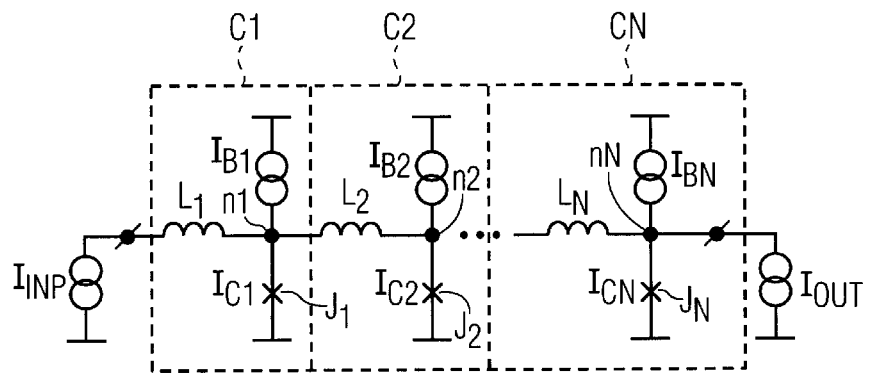
FIG. 3A is a schematic diagram of a prior art exponential Josephson transmission line (JTL)
Figure 3B:
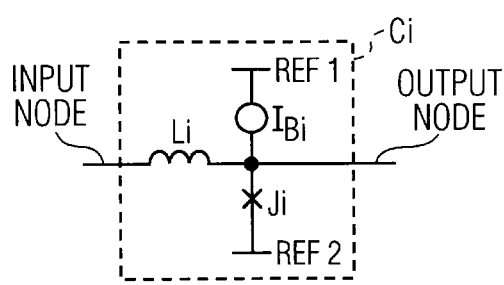
FIG. 3B is a schematic diagram of one cell of a JTL.
Figure 6:
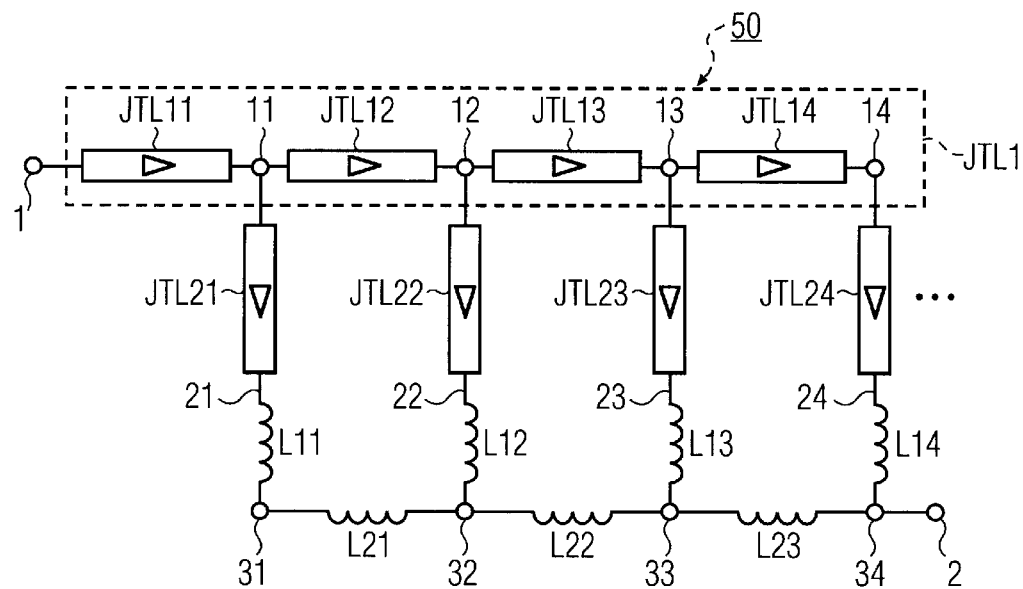
FIG. 6 is a more detailed block diagram of a JTS suitable for use in the circuit of FIG. 5A.

JTS 50, as detailed in FIG. 6, may include a first exponential Josephson transmission line (JTL1) having a plurality of output taps (e.g., 11, 12, 13, 14). JTL1 is formed of a series of JTL sections (e.g., JTL11, JTL12, JTL13, JTL14) with each JTL section including one or more cells (Ci) of the type shown in FIG. 3B.

Each cell includes an inductor L connected between the input and output nodes of the cell, a bias current source (Ib) connected between the output node of the cell and a first reference potential (REF1), and a single Josephson junction (JJ) connected between the output node of the cell and a second reference potential (REF2).

As noted above, each one of the JTL sections in JTL1 may include one, or more, cells Ci connected in cascade (i.e., serially).

A second set of JTLs denoted as JTL2$i$ are connected at their inputs to corresponding output taps (or nodes) 11, 12, 13 and 14 and at their outputs to output nodes 21, 22, 23 and 24. JTL21 is connected between nodes 11 and 21, JTL22 is connected between nodes 12 and 22, JTL23 is connected between nodes 13 and 23, and JTL24 is connected between nodes 14 and 24. The output signals produced at nodes 21, 22, 23 and 24 are coupled via respective inductors L11, L12, L13 and L14 to corresponding output nodes 31, 32, 33 and 34. The signals at these nodes (31, 32, 33, 34) are then combined at terminal 34 via an inductor L21 which is connected between nodes 31 and 32, an inductor L22 which is connected between nodes 32 and 33, and an inductor L23 which is connected between nodes 33 and 34. The combined output at node 34 is connected to output terminal 2, which may be the same point as node 34.

The JTL2$i$ sections provide gain and isolation to the signals being propagated along JTL1. Each one of the JTL2$i$ sections may include one or more serially connected cells of the type shown in FIG. 3B. However, it is advantageous to have each JTL2$i$ include at least two serially connected cells to ensure that nodes 11, 12, 13 and 14 are fully isolated from, and not affected by, the loading of the output terminal 2.

The input stage JTL11 of JTL1 of JTS 50 is designed to convert the input signal into pulses. At the very first stage (JTL11) of JTS 50, a slowly changing input signal voltage is converted into pulses whose frequency vary as a function of the signal amplitude. Therefore, the signal exists as a stream of pulses (pulse train) and the signal amplitude is encoded in the frequency of the pulse train. These pulses produced at the output of the first stage are propagated along the JTLs and each stage along the JTL chain adds energy to the pulses being propagated. Current gain may be provided by increasing the size of the Josephson junctions along the chain.

The circuit is designed to automatically separate pulses, since only pulses can be amplified in JTLs (no pulses—no gain). Actually, one important criterion is that in any JTL cell, the product of the critical current of the JJ and the inductor should be close to one half of a magnetic flux quantum $\phi_0$. This is a reason, in particular, why an exponential JTL with large number of stages is impractical and has to be replaced with a JTS (see FIG. 6 below). It can be explained as follows: at some point the critical currents of the stages (which should exponentially increase along the line) become so large that the corresponding inductors become impossible to lay out.

Figure 7:
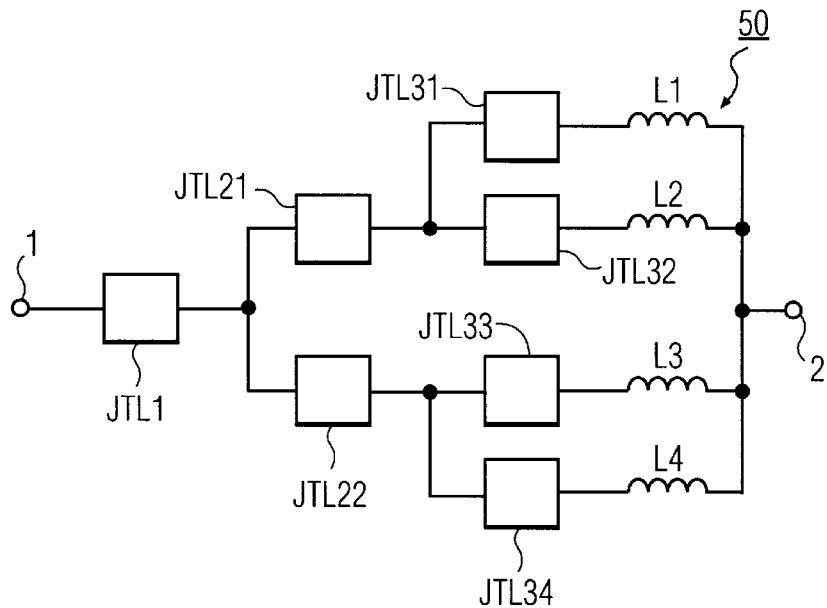
FIG. 7 is a block diagram of a JTS comprised of JTLs interconnected as a binary tree to form an analog amplifier in accordance with the invention.

The limitation on the junction size results from the limitation on inductance: when a JJ becomes physically large, its intrinsic geometric inductance also becomes large, and that is exactly what prevents or limits their use. To overcome limitations on the maximum size of the JJ's and the minimum size of the cell inductors, the cells of the JTL may be connected, in accordance with the invention, as a broadcasting network as shown in FIG. 6 or as a binary tree as shown in FIG. 7. The outputs of the various JTL networks may then be combined as shown in FIGS. 6 or 7. In addition, as the pulses are propagated along JTL1, they undergo a certain delay in each stage, in addition to gaining energy. For a given limit on a junction size, the available current gain becomes simply proportional to the number of JTS branches (i.e., to the number of individual outputs, each having a limited output current).

FIG. 6 illustrates that a JTL can be configured with a low-pass filtering technique. This is achieved by introducing delays between the points of output current collection. Output connections, or output "taps", are formed at multiple places along JTL1. The signal from each connection is sent into another set of JTLs (JTL2$i$) and the outputs of the JTL2$i$ networks are combined. By adding a signal to a delayed copy of itself, rapid changes, or high-frequencies, are canceled out, effectively creating a low-pass filter. Adding more taps can give a "higher-order", sharper frequency cutoff, or other characteristics, depending on the design requirements. This circuit is a "transversal filter", with the cutoff frequency time constant of the filter being of the order of the delay between the first and last tap. Many variations of this circuit, especially of the delays at each tap, are possible. The correct combination of timing delays along the JTLs and the selection of the taps produce the desired filter characteristics. Since any fragment of a JTL can be considered a separate, smaller JTL, this approach is completely modular and can be applied to a variety of combinations of JTLs and JTL fragments.

Figure 8A:
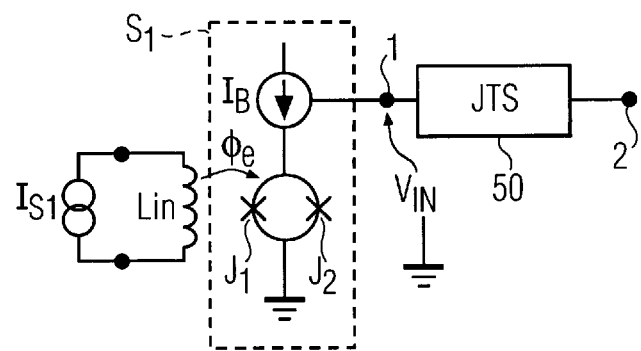
FIGS. 8A, 8B, 8C and 8D are schematic diagrams of input circuits to drive the JTS circuits in accordance with the invention.
Figure 8B:
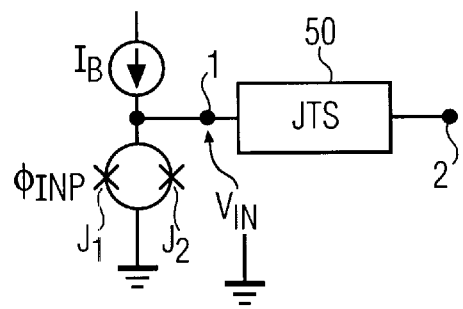
Figure 8C:
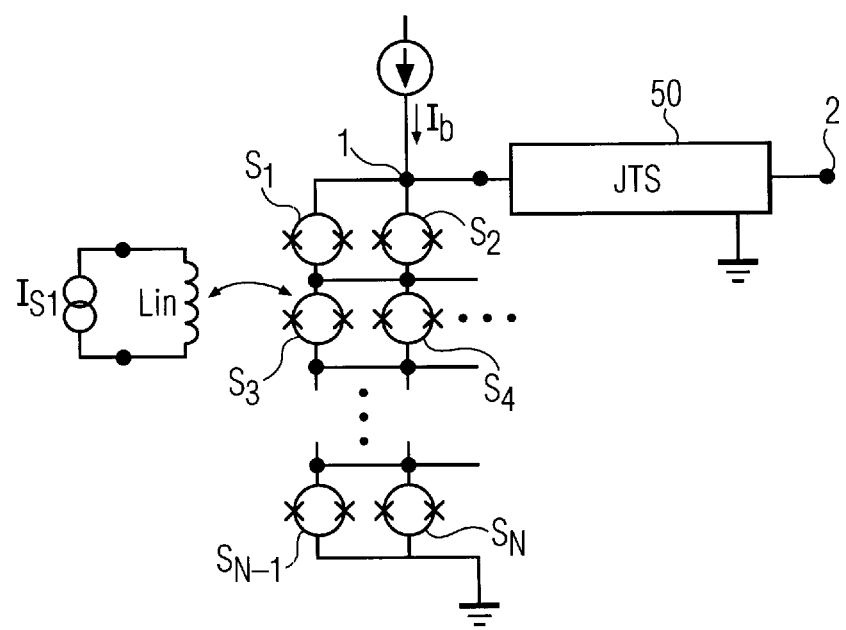

In amplifier systems embodying the invention, the JTS circuit is preferably driven by a voltage source (i.e., a low impedance source). A particularly useful and advantageous combination is the use of a dc SQUID connected to the input of the proposed superconducting analog amplifier. The dc SQUID device works as a flux-to-voltage transducer and hence enables magnetic isolation between the input and output of the amplifier. The dc SQUID biased by dc current $I_b$ can be connected directly to the JTS or JTL input, as shown in FIGS. 8A, 8B and 8C. This combination of dc SQUID and exponential JTL or JTS is a natural form of a cascaded superconducting amplifier.

Figure 8D:
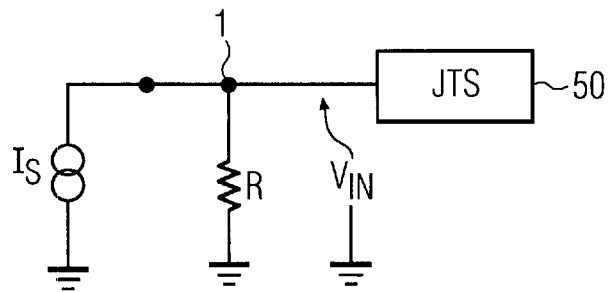
Figure 8E:
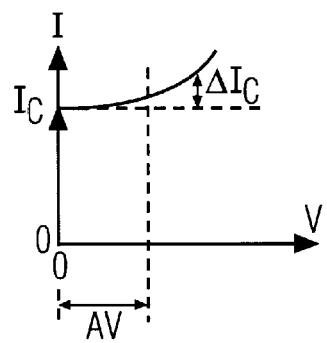
FIG. 8E is a diagram of the current-voltage (I–V) response of a non-hysteretic Josephson junction (JJ)

In FIG. 8A, a signal current Is1 is applied to a transformer which is used to magnetically couple the signal to a SQUID to convert the input current signal into a signal voltage which is applied to terminal 1 of a JTS. In FIG. 8B, an input flux signal $\phi_{INP}$ is magnetically applied to a SQUID to convert the flux signal into a voltage signal which is then applied to terminal 1 of a JTS. FIG. 8C shows the combination of a magnetically controlled voltage source cascaded with a JTL. A voltage source consists of an inductor coupled to an array of biased SQUIDs. The SQUID array may be any series and/or parallel combination of SQUIDs, depending on the characteristic impedance of the JTL. In many cases, as shown in FIGS. 8A and 8B, a single SQUID suffices. Current is sent through the inductor, $L_{IN}$, which modulates the magnetic field of the SQUID array. This modulates the voltage across the SQUID array. A voltage at the input of a JTL generates a train of SFQ pulses with a higher or lower frequency, depending on the voltage. Therefore, the inductor current modulates the rate of fluxon production. In the circuits of FIGS. 8A, 8B and 8C, the bias current Ib is selected to have a value in excess of the critical currents (Ic) of the Josephson junctions (J1, J2) to bias these junctions to their voltage states (i.e., above Ic in FIG. 8E). In FIG. 8D, a signal current Is supplied to a resistor R connected between input terminal 1 and ground to produce an input signal voltage.

Returning to FIGS. 5A, 5B and 6, note that a train of fluxons is sent into the input end (input terminal 1) of the JTS. The JTS functions to amplify the fluxons while they propagate along the JTS and emerge with more energy at the output end (output terminal 2) of the JTS 50. The magnetic flux then enters the output inductor L50, contributing to its current. Without the flux release device 51, the circuit functions as an integrator of fluxons, because once a fluxon arrives at the inductor and adds to the inductor current, it can not leave the inductor. The flux release device 51 is used to prevent the buildup of flux in the inductor. The resistance of flux release device 51 allows the circuit to act as a non-integrating amplifier over a certain frequency range (from DC to approximately f=R/L; where L is the inductance of L50 and R is the resistance of the flux release device 51. To transmit (propagate) the signal to a load, the output inductor L50 may be magnetically coupled to some magnetic field-dependent circuit, such as an array of biased SQUIDs. Since the inductor L50 accumulates a large number of fluxons, the ripples caused by individual fluxons are comparatively small. This, in effect, produces a smooth (filtered) output signal. The circuit comprising JTS 50, L50 and device 51 is magnetically coupled to an array of biased SQUIDs (see FIG. 9A) which behaves as an integrating flux-to-voltage converter.

The flux release device 51 may be a resistor (see FIG. 5B), in which case the circuit behaves as a non-ideal ("leaky") integrator with a time constant of L/R. Over the low frequency range from DC to R/L, the circuit behaves as a non-integrating amplifier. The resistor may have a current source connected in parallel with it, a configuration which is equivalent to a voltage source with a resistance in series.

Figure 9A:
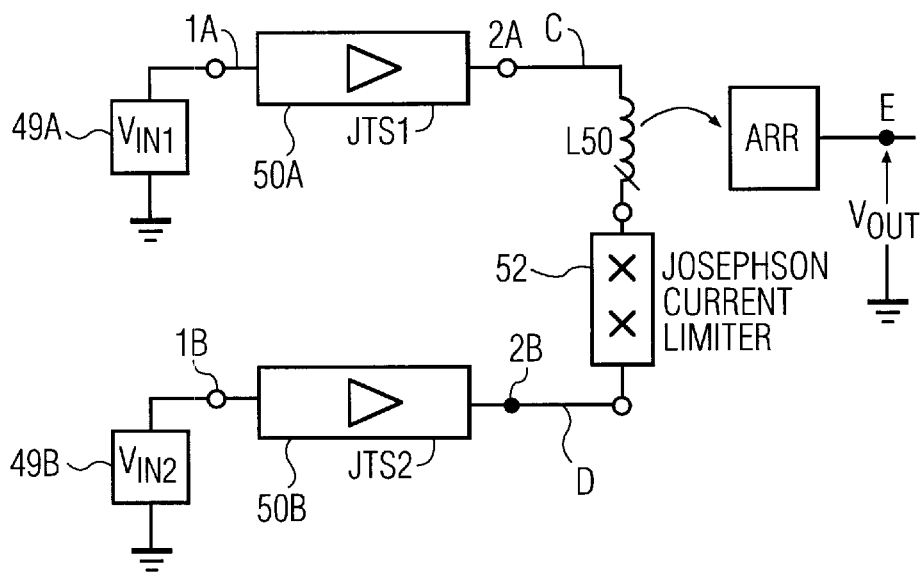
FIG. 9A is a block diagram of an operational amplifier embodying the invention.

The flux release device 51 may be the output of a different, biased JTS, such as JTS2 in FIG. 9A. In that case, the effective resistance is extremely low, while the range of the voltage matches that of the primary JTS. Since, in FIG. 9A, JTS1 is introducing fluxons into one end of the inductor, and JTS2 is introducing fluxons into the other end, the fluxons from JTS2 are of opposite polarity to the ones from JTS1, so they tend to cancel each other. This is, effectively, the same thing as removing or releasing fluxons from the inductor. This makes the amplifying circuit behave like a differential, integrating amplifier, since the net current in the load inductor is proportional to the integrated difference between the voltage applied to JTS1 and the voltage applied to JTS2.

Flux release device 51 may be essentially, a generalized voltage source having either a finite or vanishingly small internal resistance.

Figure 5B:
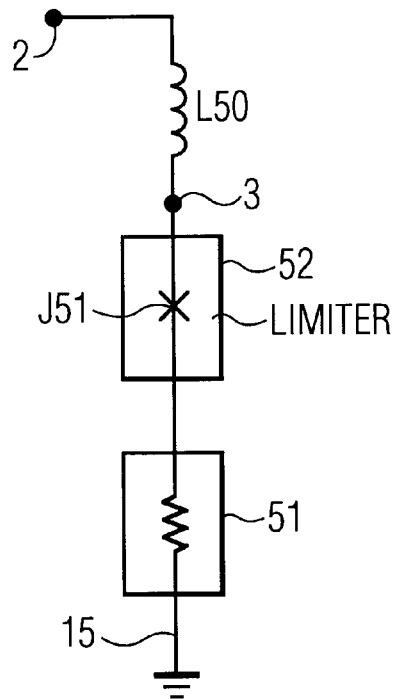
FIG. 5B is a schematic diagram of a load circuit useful in the circuit of FIG. 5A, including a current limiter in series with an inductive load and a flux release device in the form of a resistor.

In FIG. 5B a limiter 52 is connected in series with the load inductor L50 and a flux release device 51 between output terminal 2 and ground. FIG. 5B illustrates that the limiter 52 may be formed using a Josephson junction J51 and the flux release device, in its simplest form, may be a resistor. The Josephson junction can be used as a saturation protection technique. The critical current (Ic) of the Josephson junction (e.g., J51) is designed to be well below the amount of current that would damage the inductor (L50). Below its Ic, the Josephson junction (J51) behaves as an inductor and can be considered part of inductor L50. Any series or parallel combination of Josephson junctions may be used. The Josephson junctions may be connected in series with the output inductor (L50) of a JTL amplifier, as shown in FIG. 5B. This insures that the circuit will recover properly after being driven into saturation.

FIG. 9A shows the interconnection of two JTSs (exemplified in FIGS. 6 and 7) to form an operational amplifier.

In FIG. 9A, JTS1 is connected at its input to input terminal 1A and at its output to terminal 2A (also denoted as "C"). JTS2 is connected at its input to input terminal 1B and at its output to terminal 2B (also denoted as "D"). A source 49A of signal voltage $V_{IN1}$ is applied to input terminal 1A and a source 49B of signal voltage $V_{IN2}$ is applied to terminal 1B. Sources 49A and 49B are preferably SQUID-type networks as shown in FIGS. 8A, 8B and 8C or a current source driving a resistor, as shown in FIG. 8D.

An output inductor L50 is connected in series with a current limiter 51 between the output 2A (or "IC") of JTS1 and the output 2B (or "D") of JTS2.

In FIG. 9A, the output inductor L50 is magnetically coupled to an array (ARR) of dc SQUIDs to provide magnetic to voltage conversion and to produce a voltage $V_{OUT}$ which is a function of the difference between $V_{IN1}$ and $V_{IN2}$. The circuit of FIG. 9A may be symbolically redrawn as shown in FIG. 9B to demonstrate its operation as a high gain operational amplifier.

Figure 9B:
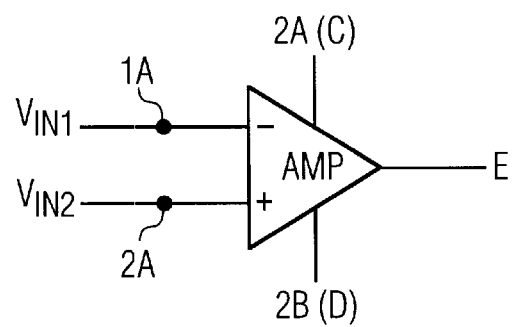
FIG. 9B is a symbolic representation of the circuit of FIG. 9A.

Before discussing the operation of the OP-AMP, note that the output stage of FIGS. 9A and 9B may be configured in several different combinations as shown, for example, in FIGS. 10A, 10B, 10C, 10D and 10E.

FIG. 10 shows several possible configurations of the output stage of the amplifier in combination with a corresponding limiter device, 51, and the coupling to arrays (ARR) of SQUIDs for producing an output voltage. One possible configuration is shown in FIG. 10A. Another configuration is shown in FIG. 10B. This configuration is symmetric and includes two individual arrays ARR1 and ARR2. The limiter circuit consists of two overdamped Josephson junctions J51A and J51B, connected in series and a source of dc bias current $I_B$.

Figure 10A:
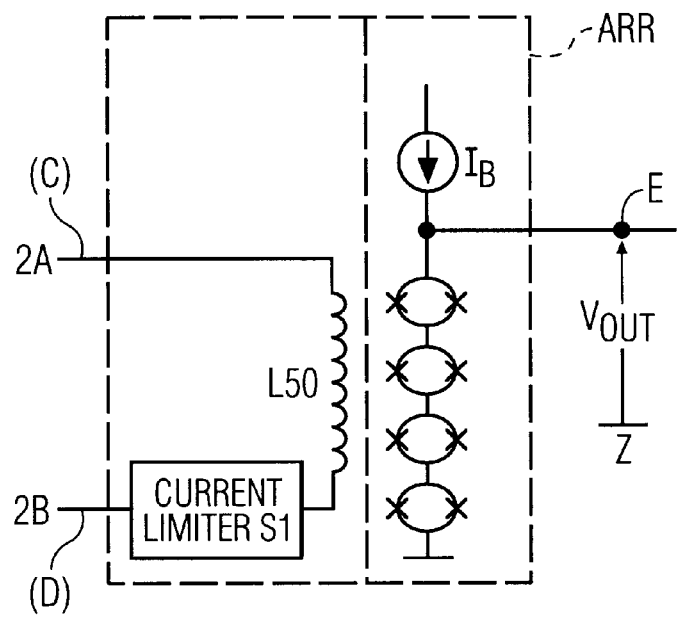
FIG. 10A is a schematic diagram detailing the output stage of an amplifier and the coupling to an array (ARR) of SQUIDs in accordance with the invention.
Figure 10B:
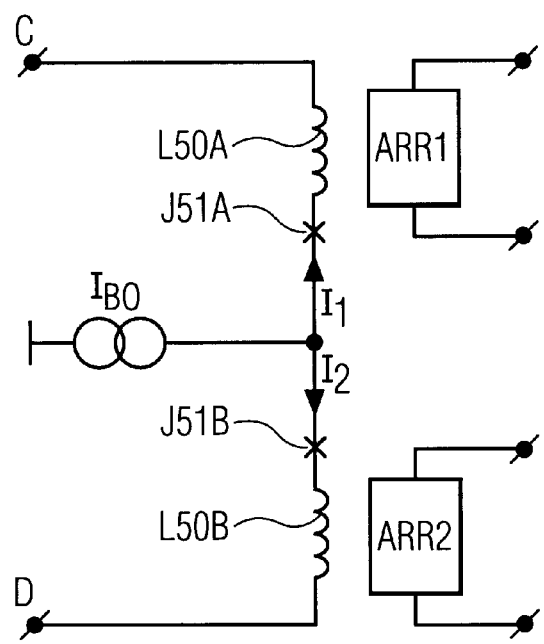
FIG. 10B is a schematic diagram of an output stage including a basic dual-array configuration of an analog amplifier in accordance with the invention.

In FIG. 10B, the limiter operates as follows. The critical currents of both junctions (J51A and J51B) are equal to the bias current $I_B$, and all these currents are equal to the maximum array control current, which produces maximum suppression of the array critical current (and hence results in maximum output voltage across the array). When the total magnetic flux which accumulates in the control loop (between points C and D) is zero, the bias current splits equally between the two limiter junctions ($I_1=I_2=I_{B0}/2$). When the voltage at point C exceeds the voltage at point D, the flux in the loop starts to grow, so I1 decreases, while I2 increases. This process continues until I1 drops to zero, while I2 reaches $I_{B0}$, which is equal to the critical current of J51B. After that, the junction J51B switches from the superconducting state to the voltage state, so the excess control flux starts to leak out through J51B, and the remaining flux stays constant. Note that because of the choice of the value of $I_{B0}$, at this moment the top array will have minimum critical current suppression (no control current), while the bottom one will have maximum suppression. As a consequence, the top array, if properly biased, will produce zero voltage, while the bottom one—maximum voltage.

Figure 10C:
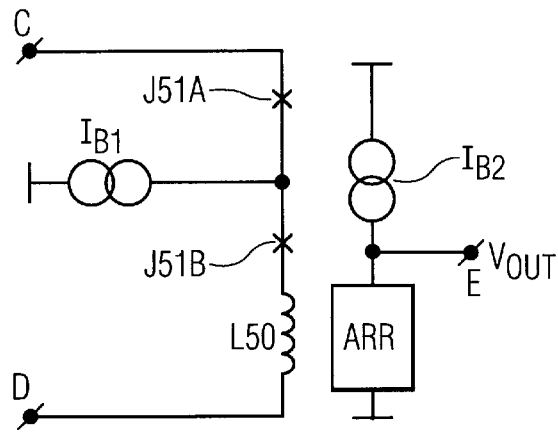
FIG. 10C is a schematic diagram of an output stage including a single-array configuration in accordance with the invention.
Figure 10D:
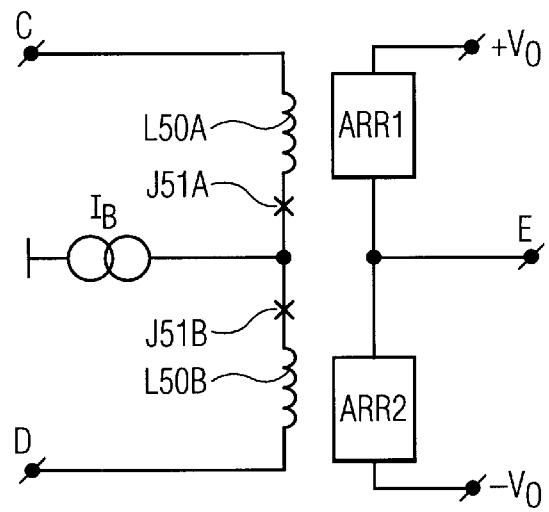
FIG. 10D is a schematic diagram of the output stage of an analog amplifier embodying the invention including a push-pull configuration with bipolar voltage.
Figure 10E:
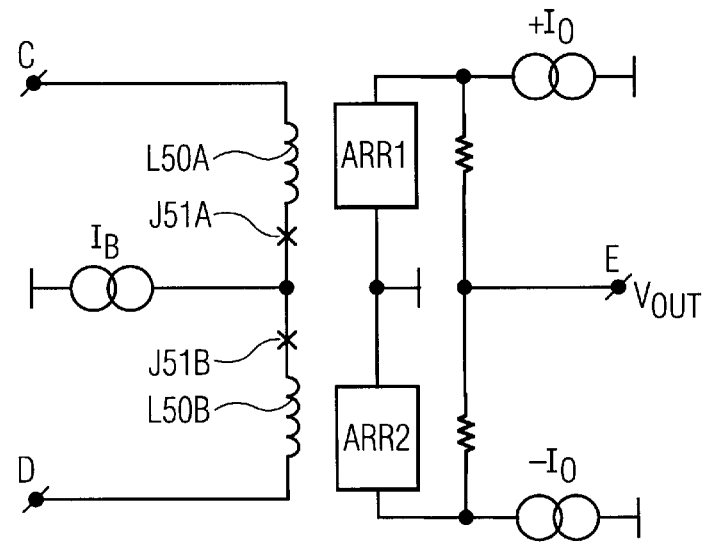
FIG. 10E is a schematic diagram of the output stage of an analog amplifier embodying the invention including a push-pull configuration with bipolar current bias.

FIG. 10C shows a reduced single-array configuration with current bias. This circuit is obtained from the one at FIG. 10B by removing the upper array and applying the current bias to the remaining array. Two other configurations use two arrays in a push-pull fashion, the first one uses bipolar voltage bias (FIG. 10D), while the second one—bipolar current bias (FIG. 10E).

The important advantage of using the proposed limiter device is monotonic response of the amplifier to the input signal, which is different from existing SQUID amplifiers, which have periodic response to the signal due to single-flux-quantum periodicity of the SQUIDS.

Figure 11A:
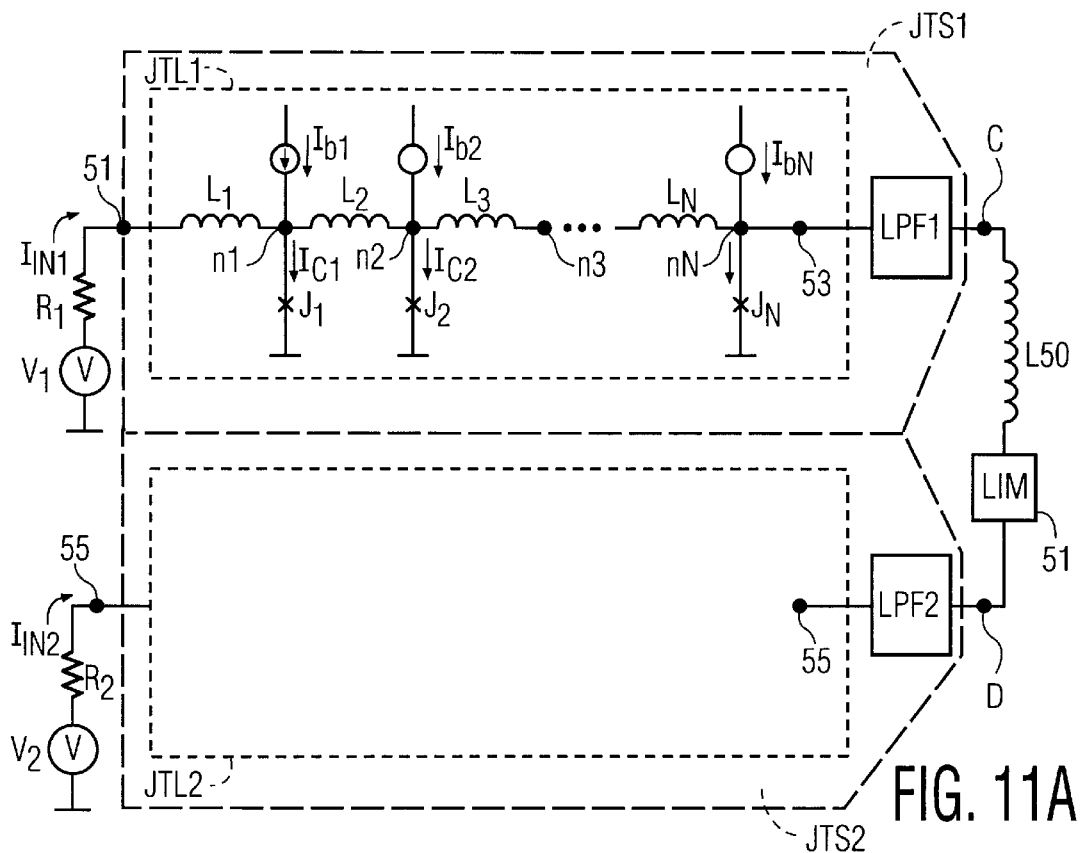
FIG. 11A is a schematic diagram of two JTLs followed by low pass filters to form an analog amplifier embodying the invention.
Figure 11B:
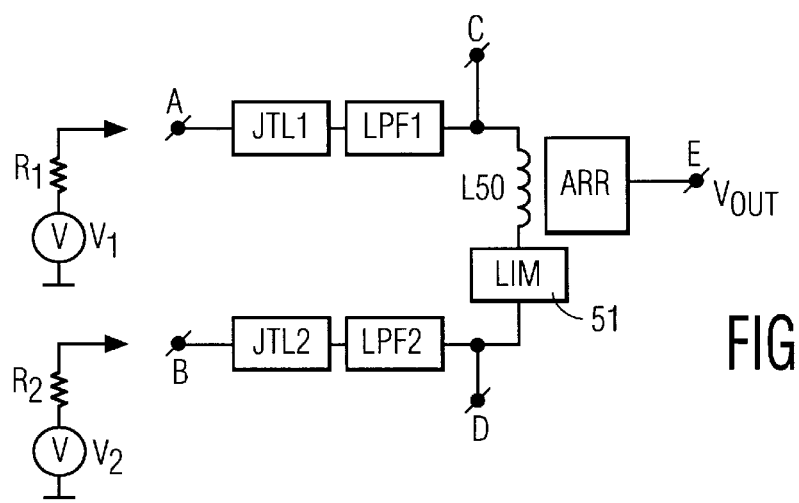
FIG. 11B is a block diagram of an operational amplifier incorporating the circuit of FIG. 11A with a SQUID array output in accordance with the invention.
Figure 11C:
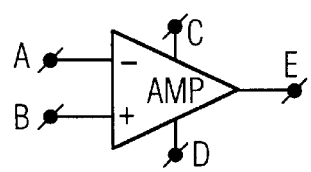
FIG. 11C is a symbolic representation of the circuit of FIG. 11B.

A JTS, in accordance with the invention, may also be formed by connecting a "pure" (exponential) JTL circuit in series with a low pass filter, (LPF) as shown for JTS1 and JTS2 in FIG. 11A. JTS1 and JTS2 are driven by input voltage signal sources (V1 and V2). The outputs (C and D) of JTS1 and JTS2 are applied to an output load inductor L50 and limiter circuit 51. L50 is magnetically coupled to an output array (ARR) of SQUIDs to produce an output voltage $V_{OUT}$ at output terminal E as shown in FIG. 11B. The circuit of FIG. 11B may be symbolically represented as an OP-AMP, as shown in FIG. 11C (and/or 9C).

FIG. 11B shows in block form an operational amplifier. It consists of two exponential JTLs, with each JTL being followed by a low-pass filter (LPF1, LPF2). The outputs of the filters LPF1 and LPF2 are connected via superconducting inductor L50 in series with a limiter device LIM 51. The two JTLs receive their inputs in the form of a voltage from the signal and reference voltage sources $V_1$ and $V_2$, respectively; these sources can have finite resistance $R_1$ and $R_2$, respectively. The output inductor L50 controls a series array of dc SQUIDS ARR, which produces the voltage output $V_{out}$. The low-pass filters (LPF1 and LPF2) prevent the Josephson junctions of the output array ARR from phase-locking with the junctions of the JTLS. Filters (LPF1 and LPF2) can be composed from cascaded LR or LRC sections.

Figure 4:
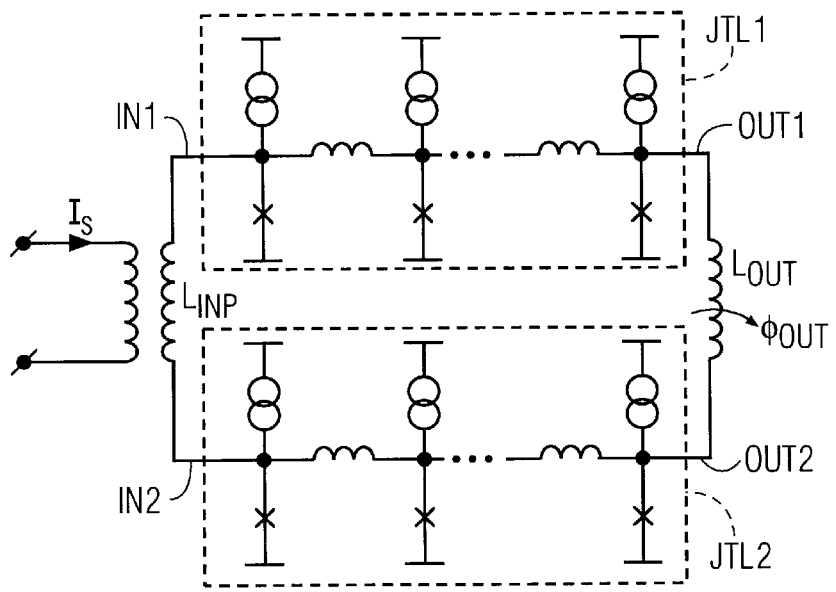
FIG. 4 is a schematic diagram of a prior art analog "flux buffer" amplifier using a pair of JTLs.
Figure 12A:
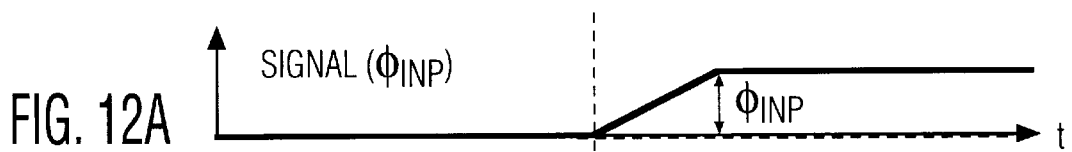
FIG. 12 is a waveform diagram comparing the operation of the prior art circuit of FIG. 4 with the operation of circuits embodying the invention.
Figure 12B:
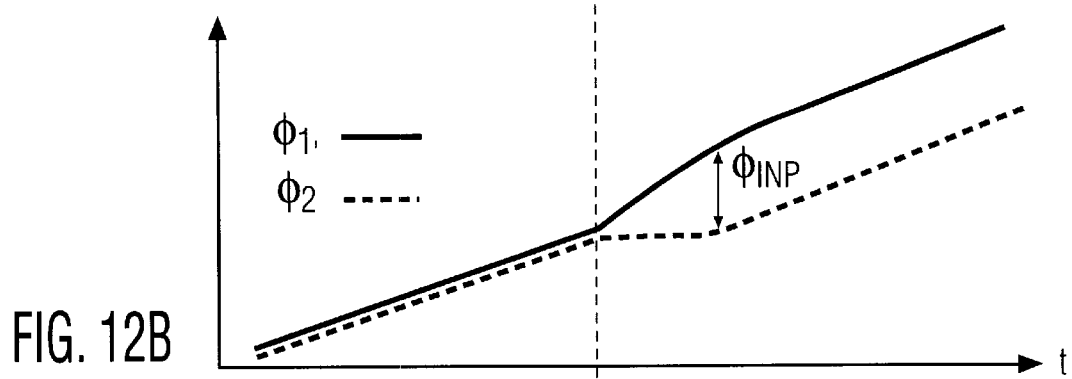
Figure 12C:
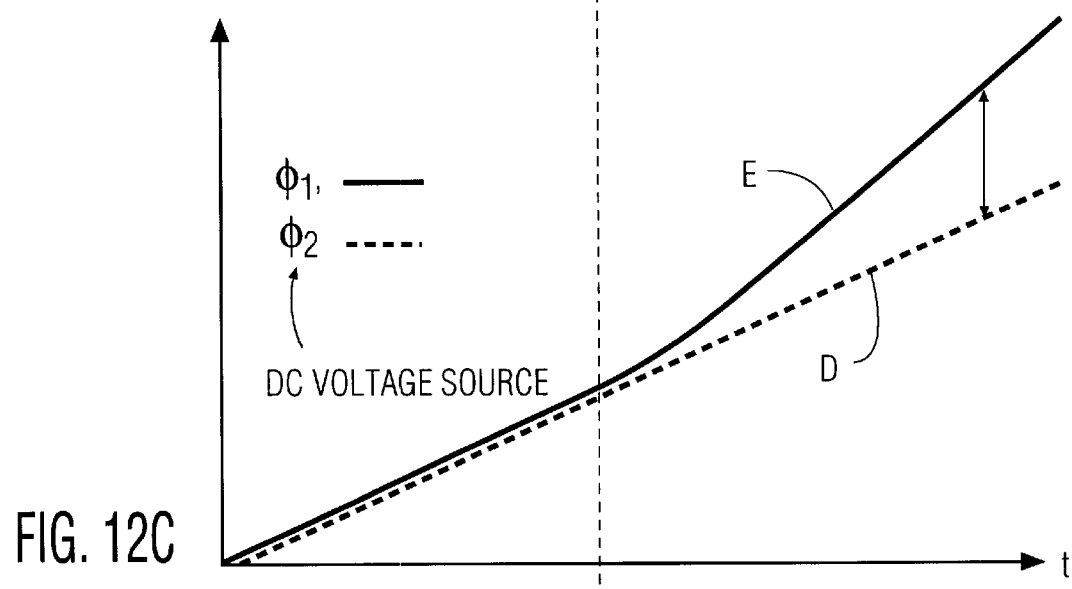
Figure 12D:
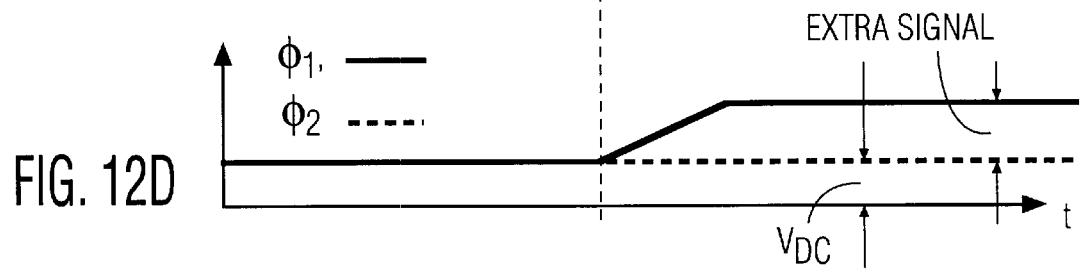

A significant difference between the analog amplifier of FIGS. 11A and 11B (and also 9A and 9B) and the "flux buffer" shown in FIG. 4 is the absence (in FIGS. 11A and 11B, and in FIGS. 9A and 9B) of a superconducting inductor connecting the inputs of the JTLs. It allows the JTLs of the amplifier of FIGS. 11A and 11B (and of 9A and 9B) to have different input voltages. The application of different input voltages to the FIG. 11 (or FIG. 9) circuits results in a higher degree of gain, as shown in FIG. 12. In response to a flux input signal ($\phi_{INP}$), the response of the prior art circuit of FIG. 4 is as shown in FIG. 12B. In sharp contrast thereto, the response of the circuit of FIGS. 11 and 9 increases with time as shown in waveform 12 which illustrates the increasing divergence between waveforms D and E as a function of time.

Another difference between the prior art circuits and circuits embodying the invention, as illustrated in FIGS. 9 and 11, is that in the inventive circuits the potential overload which could result from infinite integration of the voltage difference in the load inductor is prevented by the use of a limiter device LIM.

Still another difference is that, in circuits embodying the invention, the output of the amplifier is in form of a voltage, achieved by coupling the amplifier to arrays of SQUIDs.

As was the case for the amplifiers of FIGS. 9A and 9B, the operation of the amplifiers of 11A and 11B can be described as follows assuming an input variable $V_1$ is applied at A and a reference signal $V_2$ is applied at B. The change of input signal voltage $V_1$ compared to the reference voltage $V_2$ causes a difference between the voltages at the inputs of the two JTLs (at points A and B respectively). The voltage difference is accumulated (integrated) in the form of flux in the load inductor L50. The change in this flux results in a change in the control current applied to the output dc SQUID array, which produces a change in the output voltage. In the small-signal limit the control current grows until it causes the voltage difference between the JTLs (or the two JTLS) to drop to zero due to their finite output resistance. The output resistance decreases exponentially with the number of JTL stages, typically by factor of 3–4 per stage. Therefore, the corresponding small-signal gain at low frequencies can be made arbitrarily large. In the large-signal limit the output current changes until it reaches the saturation point established by the limiter action.

The inputs of the two JTL channels of the amplifier circuit of FIGS. 9A, 9B, 11A and 11B are symmetric and hence can be considered as its inverting and non-inverting inputs. True differentia-signal operation requires suppression of the common mode. In the case of the simplest scheme (FIG. 11A, 11B) the common mode has relatively narrow dynamic range, because the JTLs work optimally only within relatively small region of positive input voltages. This drawback may be eliminated by use of a "voltage mirror" mode of amplifier operation described below.

Figure 13:
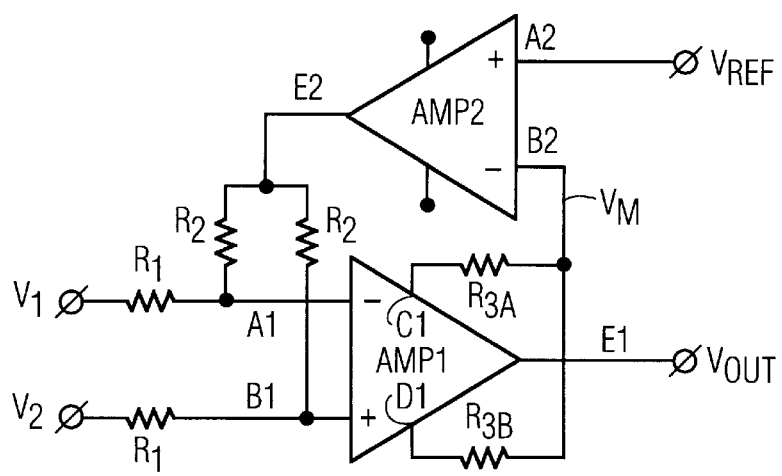
FIG. 13 is a schematic diagram of a voltage mirror feedback circuit for use with the analog amplifier of the invention.

FIG. 13 shows in block form an analog amplifier using "voltage mirror" feedback. It consists of two simple amplifiers, with each amplifier being of the type shown in FIG. 9B or 11B. AMP1 is used as the main amplifier, its outputs (points C1 and D1) are connected via two equal resistors (R3A, R3B) so their midpoint provides a mean voltage ($V_M$) across these two JTLs. The purpose of the second amplifier (AMP2) is to keep this voltage ($V_M$) constant (i.e. suppress the common mode of the first amplifier). This is achieved by applying this voltage ($V_M$) to the inverting (−) input of AMP2, while the non-inverting (+) input is attached to a source of reference potential voltage (providing the goal value). The output of the AMP2 is applied to both inputs of AMP1 via an appropriate resistive network, as shown in FIG. 13, to cancel the common-mode voltage variations of the JTLs.

As already noted, it is advantageous to connect a dc SQUID to each input of the analog amplifiers embodying the invention. This results in a separate type of operational amplifier with magnetically isolated input.

Direct connection of dc SQUIDs with JTLs may result in narrow margin for the bias current of the SQUIDs, especially if a low-noise operation is required. In this case, the use of the "voltage mirror" feedback loop (FIG. 13) can be very beneficial, because it allows the optimum working point of the SQUIDs to be stabilized without external adjustments.

Figure 14:
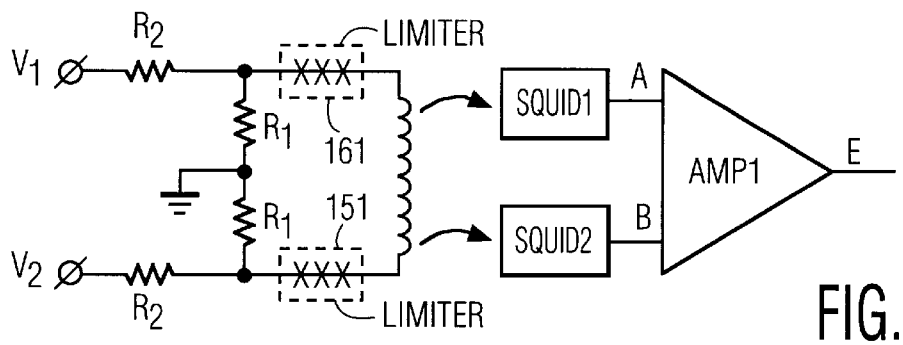
FIG. 14 is a schematic diagram of a voltage comparator with differential input and current limiting at the input.

The magnetically isolated analog amplifier, when using voltage-mode input signals instead of the flux-mode ones can naturally achieve complete common mode suppression, as shown in FIG. 14. Moreover, in the circuit of FIG. 14, the amplifier (AMP1) can be supplied with an input current limiter 151 in a similar manner to the way it was connected at the amplifier output. This input limiter 151 then prevents the input SQUIDs of the amplifier from leaving the monotonic response region. Therefore, AMP1 in FIG. 14 will work as a true differential voltage comparator with ultra-wide dynamic range.

In addition to dc SQUIDs, another important source (particularly for superconductivity) of input voltage for the proposed analog amplifier is a generator of single-flux-quantum (SFQ) voltage pulses. The average voltage V provided by such generator is exactly proportional to the frequency, f, of the generation via the Josephson relation $V=\phi_0 f$, where $\phi_0=h/2e=2.07\times10^{-15}$ Wb is the magnetic flux quantum. The importance of this source is due to the possibility to manipulate SFQ pulses by logic elements of an RSFQ logic family. In particular, these pulses can be generated by external signals via DC/SFQ converters and can be applied to ultrafast (>100 GHz) frequency dividers, thus providing the necessary elements for implementation of phase-locked oscillators. The SFQ pulses can be directly applied to the JTL inputs and propagate along them in form of fluxons until they reach the storage inductor, so when the pulse trains are applied to both inputs, the stored flux is proportional to the phase difference of these pulse trains. This mode of operation is similar to that of the "flux buffer" device. An explanation of RSFQ logic and applications thereof may be found in the following reference, the teachings of which are incorporated herein by reference: K. K. Likharev and V. K. Semenov, "RSFQ Logic/Memory Family: A New Josephson Junction Technology for Sub-Terahertz-Clock-Frequency Digital Systems", IEEE Trans. Apl. Supercond., vol. 1, 3–28, March, 1991.

The RSFQ family refers to superconducting logic circuits using magnetic single flux quantum (SFQ) pulses (fluxons) to represent binary digits (bits) and using JTLs for transmission of these SFQ pulses between logic cells. In fact, JTLs were originally developed as members of RSFQ family, not as analog amplifier devices. A good example of an RSFQ logic cell is a toggle flip-flop; when a sequence of SFQ pulses (i.e., fluxons) is applied to its input, it passes every second pulse to its output and eliminates the other ones (1:2 prescaler function). As a consequence, the average voltage, associated with this pulse train is reduced in half. Alternatively, with RSFQ logic one can combine two separate pulse trains into one pulse train (preserving the total number of pulses). This would provide a function of precise summing of two voltages.

Figure 15A:
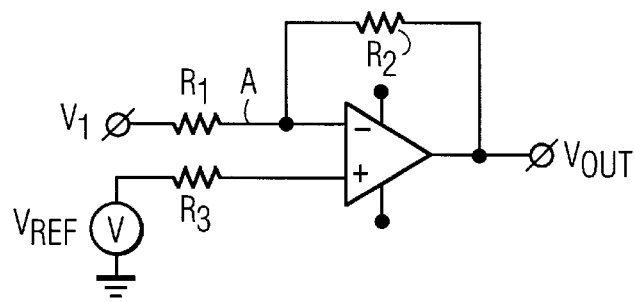
FIG. 15A is a schematic diagram of an analog amplifier embodying the invention with feedback for forming an inverting linear volt amplifier.
Figure 15B:
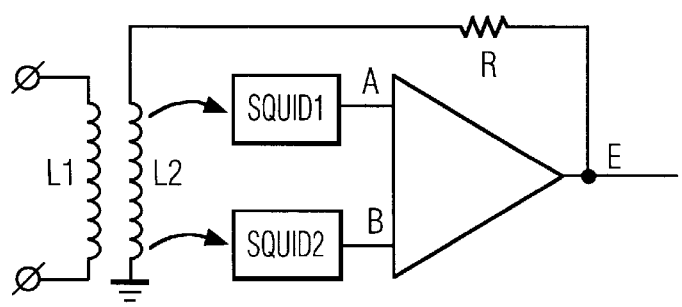
FIG. 15B is a schematic diagram of an analog amplifier embodying the invention with feedback for forming a linear flux-to-voltage converter.

In most applications operational amplifiers are used with feedback circuits coupling the output of the amplifier back to its input. FIG. 15 shows two basic feedback configurations necessary to obtain a linear inverting voltage amplifier (FIG. 15A) and a linear flux-to-voltage transducer (FIG. 15B), both possessing virtually zero output resistance.

The linear inverting voltage amplifier (FIG. 15A) is obtained by connecting the output of the basic operational amplifier with its inverting input via a resistor $R_2$. The inverting and non-inverting inputs are respectfully fed from the signal and reference voltage sources with resistors $R_1$ and $R_3$. In the limit of infinite low-frequency gain of the amplifier, the voltage $V_J$ at the input of the reference JTL depends only on $V_{ref}$ and $R_3$, so the feedback system will keep the voltage at the input of the signal JTL equal to $V_J$, and hence will keep the sum of currents flowing to the point A of the amplifier $[(V_{out}-V_J)/R_2+(V_1-V_J)/R_J)]$ constant. This means that changes in $V_1$ will be reproduced as proportional changes of $V_{out}$ with voltage gain of $-R_2/R_1$. Note that the gain is not dependent on the load current of the amplifier, so its output resistance for low-frequency signals is virtually zero.

The linear flux-to-voltage transducer shown in FIG. 15B is obtained from magnetically isolated amplifier by applying its output voltage to the $RL_2$ circuit magnetically coupled to the amplifier input in inverting polarity. For ease of illustration, the feedback inductor ($L_2$) is shown separate from the input inductor $L_1$. However, in most cases, they can be united in one element. Similar to the circuit of 15A, in order to keep the voltages on the two JTLs of the amplifier equal to each other, the input flux $\phi_1$ (into L1) should be canceled by the feedback flux $\phi_2=V_{out}L_2/R$, so the input flux will be linearly converted to voltage: $V_{out}=-\phi_1 R/L_2$. Again, as in the circuit of 15A, the output voltage does not depend on the output current, providing virtually zero output resistance. This enables to load this transducer with superconducting inductor of the next similar stage, resulting in cascadeable linear integrators.

It has thus been shown that high gain analog amplifiers can be produced to form circuits equivalent to OP-AMPs of the semiconductor technology.

What is claimed is:

1. A combination comprising:
    a first input terminal for the application thereto of an input signal to be amplified and a first output terminal for producing thereat an amplified and filtered version of the input signal;
    a first Josephson transmission line (JTL) having an input node connected to said first input terminal and having N output taps located along said first JTL, where N is an integer greater than 1;
    N additional Josephson transmission lines (JTLs), each one of said N JTLs having an input and an output, the input of each one of said N JTLs being connected to a different one of said N output taps;
    means combining the outputs of the N JTLs and coupling the outputs of the N JTLs to said output terminal; and
    wherein each one of said JTLs includes a number of basic cells connected in cascade, each basic cell having a first node and a second node and including an inductor connected between its first and second nodes, a Josephson junction (JJ) connected between the second node and a point of reference potential and a bias current generator connected to the second node for applying a bias current to the Josephson junction.

2. A combination as claimed in claim 1, wherein each one of said N additional JTLs includes at least two basic cells connected in series.

3. A combination as claimed in claim 1, wherein said means combining the outputs of the N JTLs includes N inductors connected between the outputs of the N additional JTLs and the output terminal.

4. A combination as claimed in claim 1, further including output inductive means and a current limiting means connected in series between said first output terminal and a first output point.

5. A combination as claimed in claim 4, further including a flux to voltage converter and means magnetically coupling said output inductive means to said converter for converting the flux through the inductive means to a voltage.

6. A combination as claimed in claim 5, wherein said flux to voltage converter includes a Superconducting Quantum Interference Device (SQUID) magnetically coupled to said output inductive means.

7. A combination as claimed in claim 5, wherein said flux to voltage converter includes an array of SQUIDs stacked in series between an output point and a point of reference potential and including means supplying a bias current to said output point.

8. A combination as claimed in claim 1, further including a relatively low impedance input signal source for applying a voltage input signal to said first input terminal.

9. A combination as claimed in claim 1, wherein a flux to voltage converter is connected to the first input terminal for applying a voltage signal thereto corresponding to an input flux signal.

10. A combination as claimed in claim 1, wherein first and second Josephson junctions are connected in parallel between the first input terminal and a point of reference potential; a bias current is applied to the first input terminal; and an input signal is magnetically coupled to an inductive loop containing said first and second Josephson junctions for producing a voltage signal at said first input terminal.

11. A combination as claimed in claim 1, wherein a resistive element is connected between the first input terminal and a point of reference potential and wherein a signal current is applied to the first input terminal to develop a signal voltage across said resistive element.

12. A combination as claimed in claim 1, further including:
    a) a second input terminal for the application thereto of an input signal to be amplified and a second output terminal for producing thereat an amplified and filtered version of the input signal applied at said second input terminal;
    b) a second exponential Josephson transmission line (JTL) having an input node connected to said second input terminal and having M taps located along said second JTL, where M is an integer greater than 1;
    c) M additional Josephson transmission lines (JTLs), each one of said M JTLs having an input and an output, the input of each one of said M JTLs being connected to a different one of said M taps;
    d) means combining the outputs of the M JTLs and coupling the outputs of the M JTLs to said output terminal; and
    e) output means, including output inductive means coupled between the first and second output terminals.

13. A combination as claimed in claim 12, further including means for applying a first signal voltage to said first input terminal and a second signal voltage to said second input terminal.

14. A combination as claimed in claim 12, further including a flux to voltage converter magnetically coupled to said output inductive means for producing an output voltage signal proportional to the flux through said output inductive means.

15. A combination comprising:
    first and second Josephson transmission structures (JTSs); each JTS having an input terminal and an output terminal, and each JTS including between its input and output terminals Josephson transmission line (JTL) means and a low pass filter means;
    means for applying a first input signal to the input terminal of the first JTS, and means for applying a second input signal to the input terminal of the second JTS; and
    output means including an output inductive means connected between the output terminals of the first and second JTS.

16. A combination as claimed in claim 15, further including a flux to voltage converter magnetically coupled to the output inductive means for converting the flux therethrough to a voltage.

17. A combination as claimed in claim 15, wherein said means for applying a first input signal includes means for applying a first voltage signal to the input terminal of the first JTS and wherein said means for applying a second input signal includes means for applying a second voltage signal to the input terminal of the second JTS.

18. A combination as claimed in claim 15, wherein the low pass filter of each JTS is integrated with the JTL of that JTS.

19. A combination as claimed in claim 15 wherein each JTS includes:
    a first exponential Josephson transmission line (JTL) having an input node connected to the input terminal of its JTS and having a plurality of output taps located along said first JTL;

a plurality of additional Josephson transmission lines (JTLs), each one of said plurality of JTLs having an input and an output, the input of each one of said plurality of JTLs being connected to a different one of said plurality of output taps; and means combining the outputs of the plurality of additional JTLs and coupling their outputs to the output terminals of its JTS.

20. A combination as claimed in claim 15, wherein each JTS includes a JTL in series with a low pass filter.

21. A combination as claimed in claim 16 wherein said input terminal of the first JTS defines a non-inverting input terminal of an operational amplifier; wherein said input terminal of the second JTS defines an inverting input terminal of an operational amplifier; wherein the output terminal of the first JTS defines a first intermediate node of the operational amplifier; wherein the output terminal of the second JTS defines a second intermediate node of the operational amplifier; and wherein said flux to voltage converter includes a voltage output terminal of the operational amplifier.

22. A combination as claimed in claim 21, wherein a first SQUID is coupled to the input terminal of the first JTS; wherein a second SQUID is coupled to the input terminal of the second JTS; and wherein an input circuit is magnetically coupled to the first and second SQUIDs.

23. A combination as claimed in claim 21 further including feedback means coupled between the voltage output terminal of the operational amplifier and the inverting input terminal of the operational amplifier.

24. A combination as claimed in claim 21 further including impedance means coupled between the voltage output terminal and at least one of the intermediate nodes of the first and second JTS.

25. A combination comprising:

first and second Josephson transmission lines (JTLS); each JTL having an input terminal and an output terminal and each JTL being formed by cascading a plurality of cells between its input and output terminals; each cell of said plurality of cells having an input node and an output node and including an inductor connected between its input node and its output node, a bias current generator connected between its output node and a first point of reference potential and a Josephson junction connected between its output node and a second point of reference potential;

means for applying a first input signal to the input terminal of the first JTL, and means for applying a second input signal to the input terminal of the second JTL;

output means including an output inductive means and current limiting means connected between the output terminals of the first and second JTL; and a flux to voltage converter magnetically coupled to the output inductive means for converting the flux therethrough to a voltage.

26. The combination as claimed in claim 25 wherein said output inductive means has two ends; and wherein said output means includes a first low pass filter connected between the output of said first JTL and one end of said output inductive means and a second low pass filter connected between the output of said second JTL and the other end of said output inductive means.

27. The combination as claimed in claim 26 wherein said flux to voltage converter includes an array of superconducting quantum interference devices (SQUIDs) magnetically coupled to a said output inductive means.

28. The combination as claimed in claim 26 wherein said output inductive means includes an intermediate node located between its two ends and wherein a bias current is supplied to said intermediate node.

29. The combination as claimed in claim 28 wherein said flux to voltage converter includes first and second arrays of SQUIDs connected in series between a first voltage terminal and a second voltage terminal and wherein an output terminal is connected along the series path defining the first and second arrays of series connected SQUIDs to produce thereat an output voltage.

30. The combination as claimed in claim 27 wherein said array of SQUIDs is connected in series between first and second current supplying terminals; wherein said array of SQUIDS is divided into two groups, a first group being connected between said first current terminal and a reference point and a second group being connected between said reference point and said second current terminal; and wherein a first resistor means is connected between said first current terminal and an output terminal; and wherein a second resistor means is connected between said output terminal and said second current terminal.

31. A combination comprising:

a Josephson transmission line (JTL) means having an input terminal and an output terminal and a plurality of cells connected in cascade between its input and output terminals; each cell having an input node and an output node and including an inductor connected between its input node and its output node, a bias current generator connected between its output node and a first point of reference potential and a Josephson junction connected between its output node and a second point of reference potential;

means for applying a voltage input signal to the input terminal of the JTL;

output means including an output inductive means and a flux release means connected between the output terminal of the JTL and a point of reference potential; and a flux to voltage converter magnetically coupled to the output inductive means for converting the flux therethrough to a voltage.

32. A combination as claimed in claim 31, wherein said JTL means includes a first Josephson transmission line (JTL) having N output taps located along its length, where N is an integer greater than 1; and wherein said JTL means also includes:

(a) N additional Josephson transmission lines (JTLs), each one of said N JTLs having an input and an output, the input of each one of said N JTLs being connected to a different one of said N output taps;

(b) means combining the outputs of the N JTLs and coupling their outputs to a first output terminal for producing thereat an amplified and filtered version of the input signal; and (c) wherein each one of said JTLs includes a number of basic cells connected in cascade, each basic cell having an input node and an output node and including an inductor connected between its input node and its output node, a bias current generator connected between its output node and a first point of reference potential and a Josephson junction connected between its output node and a second point of reference potential.

33. A combination as claimed in claim 31, wherein said means for applying a voltage input signal to the input terminal includes a current bias source connected between a first point of potential and the input terminal and two Josephson junctions connected in parallel between the input terminal and a second point of potential and means for magnetically coupling an input signal to be amplified across said two Josephson junctions.

34. A combination as claimed in claim 31, wherein said means for applying a voltage input signal to the input terminal includes a resistive network connected between the input terminal and a point of reference potential and a signal current source supplied to the signal input terminal for producing a voltage level at the input terminal corresponding to the value of the input signal current.

35. A combination comprising:

a first input terminal for the application thereto of an input signal to be amplified and a first output terminal for producing thereat an amplified and filtered version of the input signal;

first, second and third Josephson transmission line (JTL) sections, each JTL section having an input node and an output node, and each JTL section including at least one cell; wherein each cell includes first and second nodes, an inductor connected between the first and second nodes, a Josephson junction (JJ) connected between the second node and a point of reference potential; and a bias current generator connected to the second node for providing a bias current to the JJ;

means connecting the input node of the first JTL section to said input terminal;

means connecting the input nodes of the second and third JTLs to the output node of the first JTL section for causing additional signal current gain within said second and third JTL; and means connected to the output node of the second JTL section and means connected to the output node of the third JTL section for coupling their outputs to, and combining their output currents at, said output terminal.

36. A combination comprising:

a first input terminal for the application thereto of an input signal to be amplified and a first output terminal for producing thereat an amplified and filtered version of the input signal;

a first Josephson transmission line (JTL) having an input point connected to said first input terminal and having an output point;

two additional Josephson transmission lines (JTLs), each one of said two additional JTLs having an input point connected to the output point of the first JTL, and each one of said two additional JTLs having an output point;

means combining the outputs of the two additional JTLs and coupling their output points to said first output terminal; and wherein each one of said JTLs includes at least one cell, each cell including: an input node, an output node, an inductor connected between the input and output nodes of the cell, a bias current generator connected between the output node of the cell and a first point of reference potential and a Josephson junction connected between the output node of the cell and a second point of reference potential.

* * * * *